United States Patent [19]
Jennings

[11] 4,161,747
[45] Jul. 17, 1979

[54] SHOCK ISOLATOR FOR OPERATING A DIODE LASER ON A CLOSED-CYCLE REFRIGERATOR

[76] Inventors: Robert A. Frosh, Administrator of the National Aeronautics and Space Administration, with respect to an invention of Donald E. Jennings, Berwyn Heights, Md.

[21] Appl. No.: 880,838

[22] Filed: Feb. 24, 1978

[51] Int. Cl.² .................. H01L 25/04; H01L 23/02; H01L 23/42
[52] U.S. Cl. .................. 357/82; 357/83; 357/74; 357/79; 357/81; 165/105
[58] Field of Search .................. 357/81, 82, 83, 79, 357/74; 165/80, 105

[56] References Cited

U.S. PATENT DOCUMENTS

| | | | |
|---|---|---|---|
| 2,815,472 | 12/1957 | Jackson et al. | 357/82 |
| 2,933,662 | 4/1960 | Boyer et al. | 357/82 |
| 3,138,495 | 6/1964 | Bylander et al. | 357/83 |
| 3,303,432 | 2/1967 | Garfinkel et al. | 357/82 |
| 3,609,992 | 10/1971 | Cacheux | 357/83 |

FOREIGN PATENT DOCUMENTS 785461  10/1957  United Kingdom ................. 357/83

OTHER PUBLICATIONS

IBM Technical Disclosure Bulletin, vol. 18, No. 4, pp. 1226-1229, Sep. 1975, Close-Cycle Liquid Nitrogen Refrigeration System for Low-Temperature Computer Operation.

*Primary Examiner*—Andrew J. James
*Attorney, Agent, or Firm*—Robert D. Marchant; John R. Manning; John O. Tresansky

[57] ABSTRACT

A diode laser mounted within a helium refrigerator is mounted using a braided copper ground strap which provides good impact shock isolation from the refrigerator cold-tip while also providing a good thermal link to the cold-tip. The diode mount also contains a rigid stand-off assembly consisting of alternate sections of nylon and copper which serve as cold stations to improve thermal isolation from the vacuum housing mounting structure. Included in the mount is a Pb-In alloy wafer inserted between the cold-tip and the diode to damp temperature fluctuations occurring at the cold-tip.

10 Claims, 2 Drawing Figures

SHOCK ISOLATOR FOR OPERATING A DIODE LASER ON A CLOSED-CYCLE REFRIGERATOR

ORIGIN OF THE INVENTION

The invention described herein was made in the performance of work under a NASA contract and is subject to the provisions of Section 305 of the National Aeronautics and Space Act of 1958, Public Law 85-568(72 Stat. 434; 42 USC 2457).

BRIEF SUMMARY OF THE INVENTION

The invention relates to a structure for isolating shock and other vibration while maintaining a good thermal link. More particularly, this invention relates to mounting structure for a vibration sensitive component, such as a laser diode, which requires shock and other vibration isolation along with good thermal conduction through the mounting structure.

Prior laser systems maintained their diodes at required cryogenic temperatures by placing the diode within a liquid helium Dewar which did not present a vibration problem. However, this arrangement did have the disadvantage of requiring the Dewar to be frequently recycled to room temperature, which, in turn, had a adverse effect on the diode characteristic to the point where it would stop lasing. It also had the disadvantage that the Dewar had to be periodically filled with helium which was both expensive and time consuming.

More recent laser systems use a closed-cycle helium refrigerator rigidly connecting the laser diode to the cold-tip of the refrigerator thereby transmitting all of the vibrations of the refrigerator directly to the diode. These vibrations cause an instability in the diode output spectrum. Either the instability in the spectrum was not recognized or the instability was recognized but the source thereof was not understood.

Accordingly, it is an object of the present invention to provide an improved mounting structure for a vibration and temperature sensitive component.

Another object is to provide an improved mounting structure capable of shock and other vibration isolation while providing good thermal conduction.

A further object is to provide an improved mounting structure which damps temperature fluctuations from a refrigeration source.

Yet another object is to provide an improved mounting structure having a improved thermal isolation capability from its support.

These and other objects of the invention are accomplished by providing a highly flexible conductive strap between the temperature source and the component which is incapable of transmitting shock or other vibrations but is, at the same time, highly thermally conductive.

DETAILED DESCRIPTION

Figure 1:
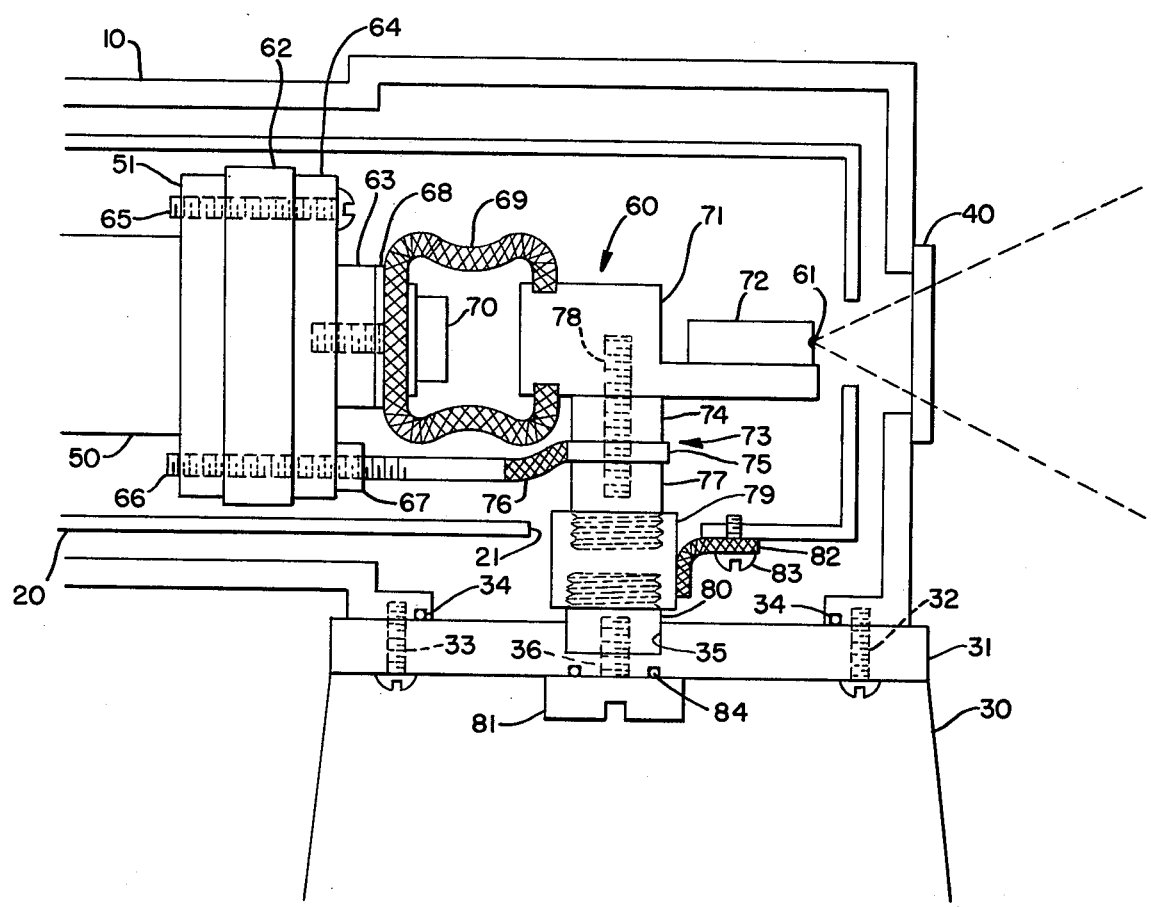
FIG. 1 is a side view of the isolator of this invention supporting a laser diode in a closed-cycle refrigerated system.

Referring to the drawing wherein identical reference numerals identify like parts, FIG. 1 depicts the rear end of a vacuum housing 10, a radiation shield 20, a housing support 30, a window 40, a helium refrigerator cold-tip 50, and a laser diode mounting structure 60 for a laser diode 61. the vacuum housing 10 is a stainless steel shroud which is box shaped at one end and may be of an approximately 2" dimension and tubular at the other end. Located within the housing is the radiation shield 20 which is tubular and may be about 1½" diameter. The radiation shield reduces the heat load due to radiation that would appear from the vacuum housing 10. The shield is composed of oxygen free high conductivity (OFHC) copper coated with nickel for increased reflectivity. It is coupled to the first stage of a helium refrigerator (not shown) to establish a 50° K. temperature. The vacuum housing 10 is supported by support 30 which may be a pylon functioning as an optical bench support. At the top of the support is a plate 31 which may be formed of stainless steel. Four stainless steel screws 32 and 33 (two not shown) may be used to rigidly fasten the vacuum housing 10 to the housing support 30 while an O-ring 34 provides a vacuum seal. The window 40 completes the vacuum tight housing structure. It may be about 1" in diameter and about 3 mm thick. In this case the window passes infrared light through and therefore may be formed of zinc-selenide, germanuim or any other material transparent to infrared.

The cold-tip 50 of the closed-cycle helium refrigerator (not shown) protrudes into the vacuum housing containing the laser diode mounting structure 60. The cold-tip is constructed of OFHC copper and is connected in a mechanically rigid, thermally conductive fashion to the second stage of the refrigerator. Its normal minimum operating temperature is about 8°–10° K. Because the cold-tip is directly connected to the second stage of the refrigerator, it is subject to the shock impulses and other vibrations occurring in the refrigerator. The most severe shock is believed to occur with the impact delivered during the expansion phase of the Solvay cycle. The cold-tip terminates in a flange 51 which aids the required mechanical coupling to the laser diode mounting structure 60. The mounting structure is considered as including everything interposed between the cold-tip flange 51 and the stainless steel plate 31, all of which is within the vacuum housing 10 and essentially within the radiation shield 20. The fundamental requirement of the mounting structure is to allow the transmission of the cold-tip temperature to the semiconductor laser diode 61 without transmitting the vibration from the cold-tip 50. Other functions of the mounting structure are to smooth out the temperature variations of the cold-tip 50, which tend to cause diode frequency instability, and to thermally isolate diode 61 from the housing support 30.

A round lead-indium (Pb-In) alloy wafer 62, of, for example, about 1½" in diameter, is mechanically secured to the cold tip flange 51 to function as a damper or thermal integrator smoothing out variations in the cold-tip 50 temperature which occur during the refrigeration cycle. A round OFHC copper washer 63 with a flange 64 of about a 1½" diameter mechanically secures the Pb-In alloy wafer 62 to the cold-tip flange 51 along with three stainless steel bolts 65 (two not shown), an OFHC copper threaded rod 66 and a stainless steel nut 67. A thin indium washer 68 is placed on the other side of copper washer 63 to provide good thermal contact with the washer.

A braided copper ground strap 69 is an essential part of the mounting structure because it provides good thermal conduction and vibration isolation. One side of the ground strap is connected, as by soldering, directly to an OFHC copper diode mount 71. The other side of the ground strap is in direct contact with the indium washer 68 which also provides a good contact to the ground strap because it is soft and highly conductive. The ground strap 69, indium washer 68 and copper washer 63 are mechanically fastened together by a bolt 70 such as a stainless steel Allen-head cap bolt.

The copper diode mount 71 provides a direct thermal contact as well as one electrical contact to a substrate contact 72 for laser diode 61. The other electrical contact to diode 61 is a wire to the other side of the diode (not shown). The semiconductor laser diode (SDL) 61 in this instance is a lead sulphur selenide (Pb S Se) diode which converts DC current to monochromatic (single frequency) light in the infrared spectrum, i.e., $\lambda = 1-30$ $\mu$m, e.g., $\lambda = 9-11$ $\mu$m (CW) when the crystal is held at cryogenic temperatures, i.e., between about 0° K. and 100° K. The essence of the problem solved by this invention is that the output frequency of the emitted light can also change with temperature or vibration. For stable operation, therefore, the diode must be shock isolated while concurrently cooled at a constant temperature.

A stand-off assembly 73 rigidly attaches the diode mount 71 to the housing support 30. This attachment must be done in a fashion that thermally isolates the mount from the support, which is at room temperature. Without thermal isolation there will be a thermal load on cold-tip 50 and diode mount 71 which will reduce the mount temperature. The requirement for a mechanically rigid structure without a substantial termal load is met by establishing two cold-stations in the stand-off assembly as will be explained hereinafter.

The standoff assembly 73 is formed of two layers of copper sandwiched between three layers of nylon which serve as thermal insulators. A nylon layer 74 directly contacts an OFHC copper layer 75 which, in turn, is connected thermally to the cold-tip 50 via the copper threaded rod 66 and a piece of braided copper ground strap 76. This arrangement establishes a first cold station at about the cold-tip temperature of about 10° K. while also vibration isolating the standoff assembly from the cold-tip. Copper layer 75 is disposed atop another nylon layer 77 which is threaded at one end. The diode mount 71, copper layer 75, and the nylon layers 74 and 77 are mechanically coupled by a nylon threaded rod 78 extending therethrough. A double-end threaded OFHC copper layer 79 is fitted to the threaded end of nylon layer 77 through an opening 21 formed in the radiation shield 20. A third threaded nylon layer 80 is fitted to the other threaded end of copper layer 79. The opposite end of nylon layer 80 fits into a recess 35 formed in stainless steel plate 31. A screw 81, preferably formed of stainless steel, fits through a hole 36 formed throught plate 31 into another threaded portion of nylon layer 80 to complete the mechanically rigid assembly. A vacuum is maintained by O-ring 84. Another braided copper ground strap 82 thermally connects copper layer 79 to radiation shield 20 with a stainless steel screw 83 to establish the second cold station at about the radiation shield temperature of about 50° K. The ground strap 82 is usually clamped to copper layer 79 to allow for rotation. Ground strap 82 also serves to isolate the assembly from vibrations carried by the radiation shield 20 due to its direct connection to the first stage of the vibrating refrigerator (not shown). The two temperature steps, i.e., 50° K. and 10° K., established by the cold-stations created at the copper layers 75 and 79 serve to lower the thermal load from assembly section to assembly section and create an effective thermal isolation between the diode mount 71 and the housing support 30 as is required to keep the diode 61 at operative temperatures.

Figure 2:
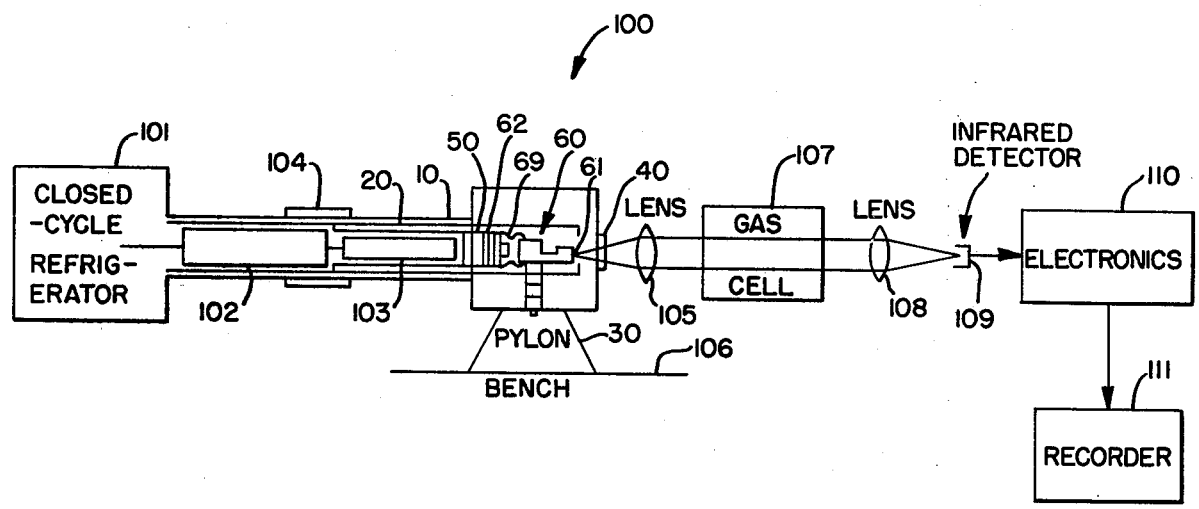
FIG. 2 is a block diagram of an infrared diode laser spectrometer used for gas analysis employing the isolator of this invention.

FIG. 2 depicts a typical infrared diode laser spectrometer 100 used to study various characteristics of gases which employs the present invention. The spectrometer includes the closed-cycle helium refrigerator 101 with its large-piston first stage 102 driving its small-piston second stage 103. A piece of rubber vacuum hose 104 serves to decouple the vibration existing at the outside of the refrigerator from the vacuum housing 10. Cold-tip 50 is at the end of the refrigerator second stage. Radiation shield 20 connects to the refrigerator first stage. Pb-In alloy wafer 62 is next to the cold-tip. Also included are the braided ground strap 69, laser diode 61, mounting structure 60, window 40 and housing support 30 placed on a bench 106. The infrared light output of the diode 61 passes through lens 105 which is used to collimate the light. The collimated light is placed through an absorption cell 107 containing a gas to be analyzed. The emerging light is then placed through another lens 108 to focus the light on an infrared detector 109 whose output voltage is related to light intensity. During this operation the diode 61 is swept in frequency by varying the current through it. The electronics 110 accepts the voltage output from the infrared detector 109, correlates it with the sweep in diode output wavelength and prepares the information in a form suitable for a recorder 111, which may be a pen recorder which will produce a written record of light intensity versus wavelength.

The principles, preferred embodiment and mode of operation of the present invention have been described in the foregoing specification. The invention which is intended to be protected herein, however, is not to be construed as limited to the particular form disclosed since this is to be regarded as illustrative rather than restrictive. Variations and changes may be made by those skilled in the art without departing from the spirit of the present invention.

What is claimed is:

1. Apparatus for maintaining a component at a substantially constant temperature and substantially isolated from vibration in a closed-cycle refrigerator, comprising:

housing means;

radiation shield means within said housing means for reducing radiaton heat from said housing means;

thermal damper means surrounded by said radiation shield means and coupled to a cold tip of said refrigerator; and means for mounting said component within said radiation shield means, including;

thermal contact means spaced from said thermal damper means for mounting said component thereon, flexible and thermally conductive strap means coupled between said thermal contact means and said thermal damper means for isolating said component from vibrations of said refrigerator and for thermally connecting said component to said cold tip, first thermal insolator means connected to said thermal contact means for thermally insolating said component, thermal conduction means connected to said first thermal insulator means and flexibly and thermally coupled to said thermal damper means for isolating said component from vibrations of said refrigerator and for maintaining said thermal conduction means at substantially said cold tip temperature, second thermal insulator means connected to said thermal conduction means for thermally insulating said thermal conduction means, another thermal conduction means connected to said second insulator means and flexibly and thermally coupled to said radiation shield means for isolating said component from vibrations of said radiation shield means and for maintaining said another thermal conduction means at substantially said radiation shield temperature, and third thermal insulator means connected to said another thermal conduction means for thermally insulating said another thermal conduction means.

2. The apparatus of claim 1 wherein said flexible and thermally conductive strap means is a braided copper ground strap.

3. The apparatus of claim 1 wherein said thermal damper means is a lead indium alloy member.

4. The apparatus of claim 1 wherein said component is a laser diode.

5. The apparatus of claim 1 further including:
thermal conduction washer means connected to said thermal damper means, and
washer means connected between said thermal conduction washer means and said flexible and thermally conductive strap means.

6. The apparatus of claim 5 wherein said thermal conduction washer means is copper and said washer means is indium.

7. The apparatus of claim 1 wherein said thermal conduction means is flexibly and thermally coupled to said thermal damper means by a braided copper ground strap.

8. The apparatus of claim 1 wherein said another thermal conduction means is flexibly and thermally coupled to said radiation shield means by a briaded copper ground strap.

9. The apparatus of claim 1 wherein said first, second, and third thermal insulator means are nylon.

10. The apparatus of claim 1 wherein said thermal conduction means and said another thermal conduction means are copper.